United States Patent [19]

Adams

[11] 4,154,663

[45] May 15, 1979

[54] METHOD OF PROVIDING THINNED LAYER OF EPITAXIAL SEMICONDUCTOR MATERIAL HAVING SUBSTANTIALLY UNIFORM REVERSE BREAKDOWN VOLTAGE CHARACTERISTIC

[75] Inventor: Robert L. Adams, Mesa, Ariz.

[73] Assignee: Texas Instruments Incorporated, Dallas, Tex.

[21] Appl. No.: 879,020

[22] Filed: Feb. 17, 1978

[51] Int. Cl.² .............................. C25F 3/12; B23P 1/00
[52] U.S. Cl. .............................. 204/129.3; 204/129.43; 204/129.75
[58] Field of Search ............ 204/129.3, 129.43, 129.75

[56] References Cited

U.S. PATENT DOCUMENTS

| | | | |
|---|---|---|---|
| 3,251,757 | 5/1966 | Schmitz | 204/129.3 |
| 3,890,215 | 6/1975 | DiLorenzo | 204/129.3 X |
| 3,959,098 | 5/1976 | Schwartz | 204/129.3 |
| 4,056,415 | 11/1977 | Cook, Jr. et al. | 204/129.3 X |

*Primary Examiner*—E. C. Edmundson
*Assistant Examiner*—D. R. Valentine
*Attorney, Agent, or Firm*—Melvin Sharp; Richard L. Donaldson; William E. Hiller

[57] ABSTRACT

Method of providing a thinned layer of epitaxial semiconductor material having a substantially uniform reverse breakdown voltage characteristic (RVBV) on a substrate, wherein stringent control is necessary in the determination of the thickness of the epitaxial layer. This method has particular application to the fabrication of high performance Read-IMPATT diodes of gallium arsenide where it is desirable to achieve a device structure in which substantially equal reverse breakdown voltage values exist across the entire substrate. A particular GaAs Read-IMPATT diode has two epitaxial layers including a relatively lightly doped first epitaxial layer disposed on the substrate and a second top epitaxial layer whose thickness must be controlled as to uniformity and as to magnitude to enable proper microwave operation of the device. The method herein disclosed accomplishes a thickness reduction in the top epitaxial layer of a GaAs Read-IMPATT diode by anodically growing an oxide on the top epitaxial layer under voltage limited conditions and then removing the oxide by cathodic reduction to achieve leveling of the top epitaxial layer to a thinned substantially uniform thickness.

7 Claims, 1 Drawing Figure

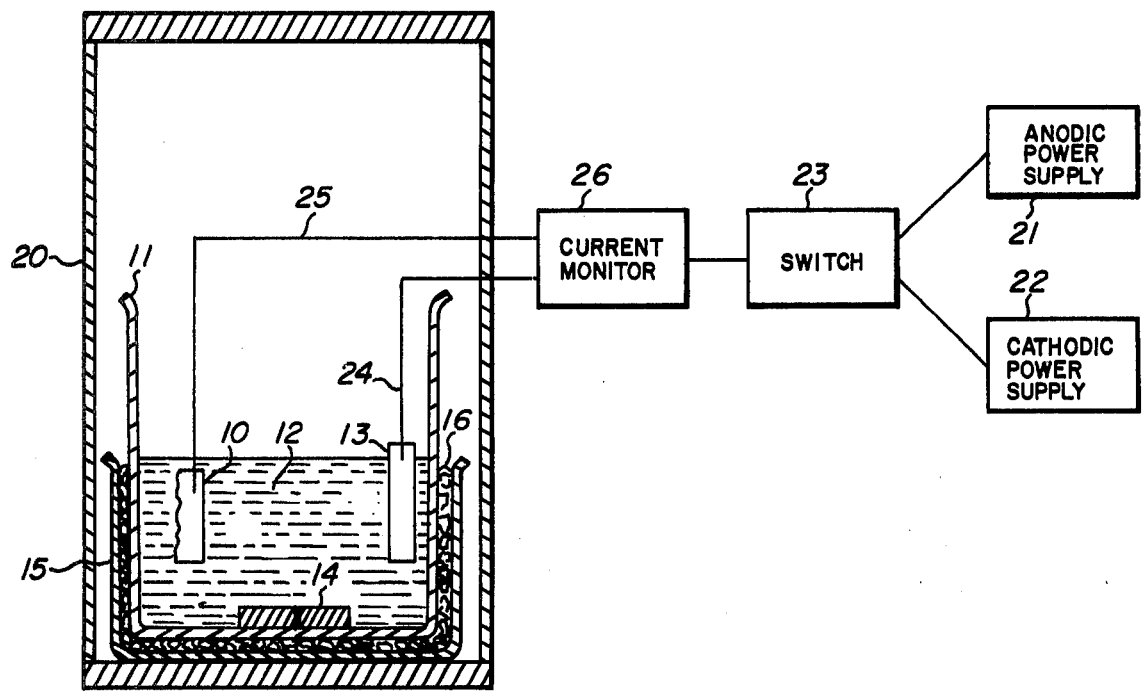

METHOD OF PROVIDING THINNED LAYER OF EPITAXIAL SEMICONDUCTOR MATERIAL HAVING SUBSTANTIALLY UNIFORM REVERSE BREAKDOWN VOLTAGE CHARACTERISTIC

This invention generally relates to a method for providing a thinned layer of epitaxial semiconductor material having a substantially uniform reverse breakdown voltage characteristic (RVBV) on a substrate. More particularly, the present invention is directed to the formation of thin, doped layers of substantially uniform thickness of epitaxial gallium arsenide and other semiconductor materials, wherein stringent controls are necessary to achieve a high degree of RVBV uniformity and magnitude. The present method has specific application in the fabrication of high performance GaAs Read-IMPATT diodes which have predetermined frequency characteristics demanding accurate control of the thickness of epitaxial layers included in the device structure.

Typically, epitaxial gallium arsenide layers for microwave devices are formed on gallium arsenide substrates by a chemical vapor deposition technique involving hydrogen chloride transport. Such a technique produces a high growth rate of epitaxial gallium arsenide, exceeding 1,000 Angstroms per minute, for example. Thus, where a thin epitaxial layer of gallium arsenide is needed, such as would be the case in the operation of a high frequency device, this chemical vapor deposition will be completed in a very short time, thereby tending to make the control of thickness of the epitaxial layer uncertain. Where excessive thickness of the epitaxial deposit has occurred, thinning of the epitaxial layer by chemical etching to the desired thickness has been attempted. Thickness uniformity of the epitaxial layer under such conditions is difficult to achieve due to various factors, such as variations in substrate temperature and in reactant flow rate. Therefore, after the chemical etching procedure has been completed, the resulting thinned epitaxial layer is still likely to exhibit variations in thickness which may contribute to faulty performance of the device.

Other techniques employed in the preparation of epitaxial gallium arsenide layers of suitably uniform thickness for satisfactory performance in electronic structures have included the deposition of epitaxial gallium arsenide on a heated substrate via molecular beam transport of gallium and arsenide to the substrate and the use of radio frequency sputtering for depositing thin epitaxial layers. However, the molecular beam transport technique does not exhibit sufficient control on the growth of such epitaxial gallium arsenide layers to obtain a predetermined thin layer of epitaxial gallium arsenide of uniform thickness for use in a high performance electronic structure, such as a GaAs Read-IMPATT diode. In this respect, the growth of epitaxial layers of gallium arsenide of uniform thickness is difficult to achieve when molecular beam transport of gallium and arsenic is employed. As to radio frequency sputtering, only a constant doping profile in the grown epitaxial layer is achievable with any degree of control. Thus, where a modified doping profile is desired in the epitaxial layer of gallium arsenide, as required in a high performance GaAs Read-IMPATT diode, for example, radio frequency sputtering is not an acceptable approach for forming such an epitaxial layer.

One type of GaAs Read-IMPATT diode is a structure having two epitaxially grown layers including a relatively lightly doped first epitaxial layer deposited on a GaAs substrate and a second top epitaxial layer. Typically, the first lower epitaxial layer may have a thickness of 2–8 microns and the second top epitaxial layer may have a thickness of approximately 3,000 Angstroms, as determined by the desired frequency of operation. As previously noted, an epitaxial top layer grown by a chemical vapor deposition technique will be too thick for microwave operation and will have variations in its thickness adversely affecting the performance of the GaAs Read-IMPATT diode. A GaAs Read-IMPATT diode with a modified doping profile has a significant increase in efficiency and maximum power output at microwave frequency as contrasted with a standard IMPATT diode having a constant doping profile. However, the modified doping profile requires changes in gas composition during the growth of the epitaxial layers which dictates against the use of an RF sputtering technique as a means of growing the epitaxial layers.

Thus, the epitaxial growth of the respective lower and upper layers in a high performance GaAs Read-IMPATT diode having a modified doping profile will typically be accomplished by employing a chemical vapor deposition technique with the attendant problems relating to thickness control as previously discussed. To produce a device with a substantially equal reverse breakdown voltage value across the entire substrate thereof, it is necessary that a GaAs Read-IMPATT diode as fabricated from a wafer of gallium arsenide must have the top epitaxial layer reduced in thickness to a predetermined optimum magnitude.

A technique purportedly accomplishing this purpose is described in the published article "A Self-Limiting Anodic Etch-to-Voltage (AETV) Technique for Fabrication of Modified Read-IMPATTS" - Niehaus and Schwartz, appearing in *Solid-State Electronics*, Vol. 19, pp. 175–180 (1976). The latter publication describes a self-limiting anodization technique for the thinning of an epitaxial GaAs layer to a predetermined uniform thickness in an effort to achieve a Read-IMPATT diode having a particular reverse breakdown voltage, wherein the Read-IMPATT diode is provided with a modified doping profile so as to enhance the efficiency and maximum output power thereof at a specific microwave frequency. This technique is purportedly made self-limiting by setting the anodization voltage at the same value as the desired reverse breakdown voltage where the doping profile is such that the reverse breakdown voltage increases as the anodization proceeds. Following the anodic oxidation of a portion of the top epitaxial GaAs layer, etching by chemical means was employed to remove the anodic oxide layer. In this connection, the anodic oxide layer is a form of Ga/As/O whose exact chemical composition is uncertain. This anodic oxide layer was removed by dissolving it with a dilute acid or base in which it is soluble. In practice, however, the reliability of this technique, which depends upon chemical etching to remove the anodic oxide layer, may not be reliable in achieving uniform thickness in the epitaxial GaAs layer being thinned. In the latter connection, the problems inherent in chemical etching with respect to achieving thickness uniformity are likely to persist, and as a consequence, the epitaxial layer after completion of the chemical etching to remove the anodic oxide layer therefrom may exhibit variations in thickness of a degree sufficient to adversely affect the operating performance of a Read-IMPATT diode including such an epitaxial layer as a component thereof.

SUMMARY OF THE INVENTION

In accordance with the present invention, an improved method of providing a thinned layer of epitaxial semiconductor material having a substantially uniform reverse breakdown voltage characteristic (RVBV) is provided, wherein an oxide layer is anodically grown on the epitaxial layer under voltage limited conditions and is susbsequently removed via cathodic reduction such that the resultant epitaxial layer is thinned to provide a substantially uniform RVBV of a predetermined magnitude.

In a more particular aspect of the invention, gallium arsenide is grown as an epitaxial layer on a substrate of gallium arsenide. The substrate with the epitaxial gallium arsenide layer is then placed in a buffered liquid electrolyte solution of sodium dihydrogen phosphate in which a negative electrode or cathode of platinum is located. The epitaxial GaAs layer serves as the positive electrode or anode of the electrolytic cell which is formed. A controlled voltage is then applied across the substrate with the epitaxial gallium arsenide layer thereon and the negative electrode, thereby causing an oxide layer to be anodically grown onto the epitaxial layer of gallium arsenide. After the growth of the anodic oxide layer has been completed, the polarity of the controlled voltage across the substrate with the epitaxial gallium arsenide layer and the negative electrode is reversed, a cathodic reduction is instituted to remove the anodic oxide layer from the epitaxial gallium arsenide layer. This procedure is responsible for thinning the epitaxial gallium arsenide layer to provide a substantially uniform RVBV of a predetermined magnitude. During the anodic oxidation procedure and the subsequent cathodic reduction procedure, the liquid electrolyte solution containing the negative electrode and the substrate having the epitaxial gallium arsenide layer thereon is preferably maintained in a dark environment and under low temperature conditions approximating 0° C.

In its specific application, the present method is directed to a fabrication procedure in the production of high performance GaAs Read-IMPATT diodes having modified doping profiles for increased efficiency and maximum output power at a predetermined microwave frequency, wherein substantially equal reverse breakdown voltage values across the entire p-n junction are achieved. In the latter connection, the present method is responsible for producing a thinned top epitaxial layer of GaAs of uniform thickness of a predetermined magnitude.

BRIEF DESCRIPTION OF THE DRAWINGS

The single FIGURE of the drawings is a diagrammatic view, partially in cross section, and illustrating a system for accomplishing electrochemical optimization with respect to achieving RVBV uniformity of a predetermined magnitude in a layer of epitaxial semiconductor material by the controlled thinning thereof as disposed on a substrate in accordance with the present invention.

DETAILED DESCRIPTION

The single FIGURE of the drawings illustrates a system for accomplishing the thinning of a layer of epitaxial semiconductor material in a manner causing the epitaxial layer to have a substantially uniform RVBV of a predetermined magnitude in accordance with the present invention. In particular, the present method has specific application in the fabrication of high performance electronic devices operable at microwave frequencies such as Read-IMPATT diodes having a modified doping profile for enhanced efficiency and maximum output power at microwave frequency. In this connection, GaAs Read-IMPATT diodes may have first and second epitaxially grown GaAs layers on a GaAs substrate, wherein the first or lower epitaxial layer is disposed on the substrate, being relatively lightly doped and with a thickness of 2-8 microns. The second or top epitaxial layer is more heavily doped and has a final thickness of approximately 3,000 Angstroms. To achieve this thickness, the top epitaxial layer must be subjected to a thickness-reduction technique to produce a thinned top epitaxial layer of required thickness and of a predetermined magnitude. The accomplishment of these structural features in the top epitaxial layer enables the completed GaAs Read-IMPATT diode to exhibit a substantially equal reverse breakdown voltage characteristic across the complete area of the p-n junction thereof.

After the epitaxial layer of gallium arsenide to be treated in accordance with the present invention has been grown on a gallium arsenide substrate in a manner producing a modified doping profile in the structure, wherein the gas compositions maintained in the chemical vapor deposition reactor during the epitaxial growth cycle are varied in accordance with a predetermined plan to achieve a modified dopant profile in the grown epitaxial layer, the resultant semiconductor structure 10 containing the grown gallium arsenide epitaxial layer is placed in a beaker 11 containing a liquid electrolyte solution 12. A negative electrode member of cathode in the form of a plate 13 is also disposed within the beaker 11, the semiconductor structure 10 with the epitaxial layer being wholly immersed within the electrolyte solution 12 while the negative electrode plate 13 is partially immersed therein. The epitaxial layer of the semiconductor structure 10 serves as the positive electrode or anode of the electrolytic cell formed by the electrolyte solution 12, the cathode 13 and the epitaxial layer of the semiconductor structure 10. The beaker 11 is equipped with a rotary stirrer 14 in the bottom thereof which is adapted to be driven by an electric motor for agitating the liquid electrolyte solution 12 to promote an optimum electrochemical reaction upon the application of an appropriate voltage across the device structure 10 having the epitaxial layer thereon and the cathode 13.

Anodic oxidation, as described in the Niehaus and Schwartz article referred to earlier herein, has been employed in various liquid electrolyte solutions to achieve the formation of an anodic oxide layer on the epitaxial layer of the device structure 10. This earlier work generally resulted in over-etching of the epitaxial layer, although leveling did occur resulting in substantial RVBV uniformity for the epitaxial layer. For example, the application of an anodizing voltage of 30 volts across the epitaxial layer of the device structure 10 and the cathode 13 produced a Read-IMPATT diode having a reverse breakdown voltage characteristic varying from 45-50 volts across the substrate after the anodic oxide layer was removed by chemical etching. These experimental results were achieved by employing a platinum cathode and a liquid electrolyte solution comprising a phosphoric acid buffered solution having a pH of approximately 2.5 but this system produced overetching causing a disparity of approximately 15-20 volts in the expected reverse breakdown voltage characteristic as compared to the anodization voltage of 30 volts.

In accordance with a specific aspect of the present invention, it has been determined that a liquid electrolyte solution of $NaH_2PO_4$, sodium dihydrogen phosphate, as the buffer and having a pH of approximately 4.4 with a concentration of $NaH_2PO_4$ of approximately 0.03 moles in conjunction with a platinum cathode 13 produces superior results in achieving thinning of the top epitaxial layer in a Read-IMPATT diode structure 10, wherein the top epitaxial layer was thinned to a required thickness of a predetermined magnitude enabling high performance of the device. Use of the sodium dihydrogen phosphate as the buffered liquid electrolyte solution 12 was accompanied by performing the anodic oxidation treatment on the device structure 10 having the epitaxial layer in the absence of light and at moderately low temperatures, i.e. 0° C. To this end, a second beaker 15 containing ice 16 was provided. The beaker 11 was positioned within the beaker 15 so as to be maintained at a low temperature by the ice 16 which surrounded the portion of the beaker 11 in which the liquid electrolyte solution 12 was disposed. The two beakers 11, 15, the ice bath provided by the ice 16 in the beaker 15, and the liquid electrolyte solution 12 contained by the beaker 11 with the platinum cathode 13 and the device structure 10 with the epitaxial layer immersed therein were placed within a light-tight box or housing 20.

After the anodic oxide layer has been grown on the epitaxial layer of the device structure 10, rather than remove the anodic oxide layer via chemical etching, such as by employing hydrochloric acid as a chemical etchant in a separate operation, the present method contemplates the removal of this anodic oxide layer by reversing the polarity of the electrochemical system and employing a cathodic reduction treatment on the anodic oxide layer. Thus, the present method enables thinning of the epitaxial layer of semiconductor material to provide a substantially uniform RVBV of a predetermined magnitude in the epitaxial layer by an "in situ" procedure requiring no additional manual handling of the device structure until it is removed from the liquid electrolyte solution at the conclusion of the cathodic reduction procedure. Employing this cathodic reduction technique with a top epitaxial layer of GaAs on a GaAs Read-IMPATT diode having a modified dopant profile, a resultant device having a spread of 3-4 volts in the reverse breakdown voltage characteristic ranging from 23-27 volts across the area of the p-n junction was obtained for an anodizing oxidation voltage of 22 volts.

In providing for cathodic reduction, the electrochemical system in accordance with the present invention includes both an anodic power supply 21 and a cathodic power supply 22 enabling the polarity of the system to be reversed after anodic oxidation of the epitaxial layer on the device structure 10 has occurred. The two power supplies 21 and 22 are respectively connected to the negative electrode or cathode 13 and the device structure 10 containing the epitaxial layer via a switching circuit 23 which may be manually operated in switching between the anodic and the cathodic power supplies 21 and 22. The switching circuitry 23 in turn is connected to the negative electrode or cathode 13 and the device structure 10 having the epitaxial layer thereon via electrical conductors 24 and 25, respectively, in order to provide an electrical potential across the electrodes. Preferably, a current monitoring circuit 26 is interposed between the conductors 24 and 25 connected to the cathode 13 and the device structure 10 and the switching circuitry 23 to enable a close control to be maintained on the electrochemical reaction which occurs. The controlled voltage for the electrochemical reaction can be set at a magnitude corresponding to the desired reverse breakdown voltage value for the completed Read-IMPATT diode. By employing cathodic reduction as the technique in thinning the top epitaxial layer of GaAs in a GaAs Read-IMPATT diode structure, it is possible to maintain a thickness control for the epitaxial layer of between 100-1,000 Angstroms, and under carefully monitored restrictive conditions of 100-200 Angstroms. Such a procedure thereby enables high-yield fabrication of high performance GaAS Read-IMPATT diodes.

While the method herein disclosed has been described with particular reference to the thinning of a top epitaxial layer of gallium arsenide in a GaAs Read-IMPATT diode structure to a required thickness of a pedetermined magnitude, it will be understood that this method is applicable to the thinning of layers of other compound semiconductor materials, such as GaP, for example, and other semiconductor materials, such as silicon, in any electronic device where an extremely thin epitaxial layer of uniform thickness is required in the presence of a suitable liquid electrolyte solution and appropriate chemical conditions. Accordingly, while the invention has been particularly shown and described with reference to the specific embodiment disclosed herein, it will be understood by those skilled in the art that various changes in form and detail may be made therein without departing from the spirit and scope of the invention.

What is claimed is:

1. A method of providing a thinned layer of epitaxial semiconductor material exhibiting a substantially uniform reverse breakdown voltage characteristic, said method comprising:

anodically growing an oxide layer on an epitaxial layer of semiconductor material disposed on a substrate by applying a controlled voltage of a given polarity thereto under voltage limited conditions, and removing said oxide layer from said epitaxial layer by reversing the polarity of the controlled voltage and employing cathodic reduction such that said epitaxial layer is thinned to a substantially uniform thickness.

2. A method of providing a thinned layer of epitaxial gallium arsenide exhibiting a substantially uniform reverse breakdown voltage characteristic on a substrate of gallium arsenide, said method comprising:

placing said gallium arsenide substrate with said epitaxial gallium arsenide layer thereon in a liquid electrolyte solution, providing a cathode in the electrolyte solution in spaced relation to said gallium arsenide substrate with said epitaxial layer of gallium arsenide thereon, anodically growing an oxide layer onto said epitaxial layer of gallium arsenide by applying a controlled voltage across said gallium arsenide substrate having said epitaxial layer of gallium arsenide thereon and said cathode, and removing said oxide layer from said epitaxial layer of gallium arsenide by reversing the polarity of the controlled voltage and employing cathodic reduction such that said epitaxial layer of gallium arsenide is thinned to a substantially uniform thickness.

3. A method as set forth in claim 2, wherein the liquid electrolyte solution is an aqueous solution buffered by sodium dihydrogen phosphate.

4. A method of providing a thinned layer of epitaxial gallium arsenide exhibiting a substantially uniform reverse breakdown voltage characteristic on a substrate of gallium arsenide, said method comprising:

placing said gallium arsenide substrate with said epitaxial gallium arsenide layer thereon in an aqueous liquid electrolyte solution buffered by sodium dihydrogen phosphate, wherein the liquid electrolyte solution has a pH of approximately 4.4 and the sodium dihydrogen phosphate is present therein in a concentration of approximately 0.03 moles, providing a cathode in the electrolyte solution in spaced relation to said gallium arsenide substrate with said epitaxial layer of gallium arsenide thereon, anodically growing an oxide layer onto said epitaxial layer of gallium arsenide by applying a controlled voltage across said gallium arsenide substrate having said epitaxial layer of gallium arsenide thereon and said cathode, and removing said oxide layer from said epitaxial layer of gallium arsenide by reversing the polarity of the controlled voltage and employing cathodic reduction such that said epitaxial layer of gallium arsenide is thinned to a substantially uniform thickness.

5. A method as set forth in claim 4, further including disposing the liquid electrolyte solution with the cathode and the gallium arsenide substrate having the epitaxial layer of gallium arsenide thereon immersed therein in a dark environment prior to anodically growing the oxide layer onto said epitaxial layer of gallium arsenide.

6. A method as set forth in claim 5, wherein the anodic growth of the oxide layer onto said epitaxial layer of gallium arsenide is carried out under low temperature conditions approximating 0° C.

7. A method as set forth in claim 6, wherein the controlled voltage across said gallium arsenide substrate having said epitaxial layer of gallium arsenide thereon and said cathode is maintained at 22 volts during the anodic growth of the oxide layer onto said epitaxial layer of gallium arsenide.

* * * * *